(12) United States Patent
Mori

(10) Patent No.: US 10,432,163 B2
(45) Date of Patent: Oct. 1, 2019

(54) VARIABLE FILTER CIRCUIT, HIGH FREQUENCY MODULE CIRCUIT, AND COMMUNICATION DEVICE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 115 days.

(21) Appl. No.: 15/666,869

(22) Filed: Aug. 2, 2017

(65) Prior Publication Data
US 2017/0331444 A1    Nov. 16, 2017

Related U.S. Application Data

(63) Continuation of application No. PCT/JP2016/050181, filed on Jan. 6, 2016.

(30) Foreign Application Priority Data

Feb. 2, 2015   (JP) ................................ 2015-018322
Aug. 28, 2015  (JP) ................................ 2015-168411

(51) Int. Cl.
  *H03H 7/12*   (2006.01)
  *H03H 7/075*  (2006.01)
  (Continued)

(52) U.S. Cl.
  CPC ............ *H03H 7/12* (2013.01); *H03H 7/0115* (2013.01); *H03H 7/0161* (2013.01);
  (Continued)

(58) Field of Classification Search
  CPC ............ H01Q 1/528; H01Q 1/38; H01Q 1/24; H01Q 1/42; H01Q 1/525; H01Q 9/045;
  (Continued)

(56) References Cited

U.S. PATENT DOCUMENTS 3,718,874 A * 2/1973 Cooper, Jr. .......... H03H 7/0161
                                                     333/204
4,453,145 A   6/1984 Schuster
                (Continued)

FOREIGN PATENT DOCUMENTS

JP   S60-158711 A   8/1985
JP   H06-224644 A   8/1994
            (Continued)

OTHER PUBLICATIONS

Written Opinion of PCT/JP2016/050181 dated Mar. 22, 2016.
(Continued)

*Primary Examiner* — Robert J Pascal
*Assistant Examiner* — Jorge L Salazar, Jr.
(74) *Attorney, Agent, or Firm* — Pearne & Gordon LLP

(57) ABSTRACT

The present disclosure provides a variable filter circuit capable of controlling a band width and a center frequency of a pass band, and also capable of suppressing the total number of pieces of variable reactance. That is, a variable filter circuit includes a serial arm in which a plurality of circuit elements are connected in series with respect to a signal path and a parallel arm in which a plurality of circuit elements are connected in parallel with respect to the signal path, wherein the serial arm and the parallel arm each includes a variable reactance element, a series reactance element that is connected in series to the variable reactance element and resonates therewith, and a parallel reactance element that is connected in parallel to the variable reactance element and resonates therewith.

16 Claims, 14 Drawing Sheets

(51) Int. Cl.
  *H03H 7/09* (2006.01)
  *H03H 7/38* (2006.01)
  *H03H 7/01* (2006.01)

(52) U.S. Cl.
  CPC .............. *H03H 7/075* (2013.01); *H03H 7/09* (2013.01); *H03H 7/1766* (2013.01); *H03H 7/1775* (2013.01); *H03H 7/38* (2013.01)

(58) Field of Classification Search
  CPC ............ H01Q 21/0075; H01Q 9/0457; H01Q 9/0407; H01P 3/08; H01P 3/081; H01P 3/082; H01P 7/08; H01P 7/082; H03H 7/12; H03H 7/1775; H03H 7/1766; H03H 7/0161; H03H 7/0115; H03H 7/075; H03H 7/38; H03H 7/09
  USPC ....... 333/161, 164, 204, 205, 238, 246, 175, 333/185
  See application file for complete search history.

(56) References Cited

U.S. PATENT DOCUMENTS

| | | |
|---|---|---|
| 4,901,043 A | 2/1990 | Tresness |
| 5,202,656 A | 4/1993 | Clark et al. |
| 5,697,087 A | 12/1997 | Miya et al. |
| 6,023,611 A | 5/2000 | Bolin et al. |
| 6,061,032 A | 5/2000 | Sandstedt et al. |
| 2006/0199549 A1* | 9/2006 | Lee ........................ H01Q 1/243 455/82 |
| 2010/0052813 A1 | 3/2010 | Okabe |
| 2014/0106698 A1 | 4/2014 | Mi et al. |

FOREIGN PATENT DOCUMENTS

| | | |
|---|---|---|
| JP | 2001-511973 A | 8/2001 |
| JP | 2001-512642 A | 8/2001 |
| JP | 2010-056735 A | 3/2010 |
| JP | 2010-154232 A | 7/2010 |
| JP | 2011-130083 A | 6/2011 |
| JP | 2014-123919 A | 7/2014 |
| WO | 2005/088832 A1 | 9/2005 |
| WO | 2013/005264 A | 1/2013 |

OTHER PUBLICATIONS

International Search Report for PCT/JP2016/050181 dated Mar. 22, 2016.
Japanese Office Action for 2016-573238 dated Jul. 3, 2018.

\* cited by examiner

VARIABLE FILTER CIRCUIT, HIGH FREQUENCY MODULE CIRCUIT, AND COMMUNICATION DEVICE

This is a continuation of International Application No. PCT/JP2016/050181 filed on Jan. 6, 2016 which claims priority from Japanese Patent Application No. 2015-168411 filed on Aug. 28, 2015 and from Japanese Patent Application No. 2015-018322 filed on Feb. 2, 2015. The contents of these applications are incorporated herein by reference in their entireties.

BACKGROUND

Technical Field

The present disclosure relates to variable filter circuits capable of performing frequency adjustment on a center frequency and a band width of a pass band.

Variable filter circuits capable of performing frequency adjustment on a center frequency and a band width of a pass band have been proposed (for example, see Patent Document 1). An existing variable filter circuit has a ladder configuration in which a plurality of resonance circuits are connected in parallel and series between input/output ports; each resonance circuit is configured of an inductor and variable capacitance connected in parallel to each other. In the variable filter circuit, the center frequency of a pass band can be adjusted by controlling variable capacitance of a resonance circuit in which a plurality of circuit elements are connected in series between the input/output ports (this resonance circuit is hereinafter referred to as a serial arm). Further, by controlling variable capacitance of a resonance circuit in which a plurality of circuit elements are connected in parallel with respect to the input/output ports (this resonance circuit is hereinafter referred to as a parallel arm), an attenuation pole provided at a neighborhood frequency on a lower or higher frequency side of the pass band can be adjusted.

Patent Document 1: Japanese Unexamined Patent Application Publication No. 2011-130083

BRIEF SUMMARY

In the existing variable filter circuit, a plurality of reactance elements are needed in order to obtain at least one resonant frequency on a lower frequency side of a pass band, at least one resonant frequency in the pass band, and at least one resonant frequency on a higher frequency side of the pass band. Then, at least three pieces of variable reactance are included as a minimum configuration unit necessary to perform frequency adjustment on the center frequency and the band width of the pass band. Because a variable reactance is generally larger in size than a passive element or the like, there is a problem that the variable filter circuit becomes large in size in the case where the total number of pieces of variable reactance is large. Moreover, there is another problem that the control of the variable reactance becomes complicated because of the total number of pieces of variable reactance being large.

As such, the present disclosure provides a variable filter circuit, a high frequency module circuit, and a communication device in which such a variable filter circuit can be obtained that is capable of performing frequency adjustment on a center frequency and a band width of a pass band using a serial arm including one piece of variable reactance and a parallel arm including one piece of variable reactance. To be more specific, the present disclosure provides a variable filter circuit, a high frequency module circuit, and a communication device in which the total number of variable reactance elements included in a minimum configuration unit is set to be two so as to lessen the total number of pieces of variable reactance compared to the existing technique, thereby making it possible to perform frequency adjustment on the center frequency and band width of the pass band.

A variable filter circuit of the present disclosure includes a serial arm having a plurality of circuit elements that are connected in series with respect to a signal path and a parallel arm having a plurality of circuit elements that are connected between the signal path and a ground; the serial arm and the parallel arm each include a variable reactance element, a parallel reactance element which is connected in parallel to the variable reactance and resonates with the variable reactance, and a series reactance element which is connected in series to the variable reactance and resonates with the variable reactance. Then, in each of the serial arm and the parallel arm, a frequency at which the variable reactance element and the parallel reactance element resonate is lower than a frequency at which the variable reactance element and the series reactance element resonate.

With this configuration, in a bandpass characteristic of the parallel arm as a single body, a pass band on which frequency adjustment can be performed by the resonance of the variable reactance element and the parallel reactance element can be formed, and an attenuation pole on which frequency adjustment can be performed by the resonance of the variable reactance element and the series reactance element can be formed at a neighborhood frequency on a higher frequency side of the pass band. Further, in a bandpass characteristic of the serial arm as a single body, a pass band on which frequency adjustment can be performed by the resonance of the variable reactance element and the series reactance element can be formed, and an attenuation pole on which frequency adjustment can be performed by the resonance of the variable reactance element and the parallel reactance element can be formed at a neighborhood frequency on a lower frequency side of the pass band.

Then, in a bandpass characteristic of the overall variable filter circuit, a frequency band where the pass band of the parallel arm overlaps with the pass band of the serial arm is a pass band of the overall variable filter circuit. Further, the attenuation pole present on a lower frequency side relative to the pass band of the serial arm and the attenuation pole present on a higher frequency side relative to the pass band of the parallel arm respectively serve as attenuation poles in the bandpass characteristic of the overall variable filter circuit, and steep attenuation characteristics can be obtained on both the lower frequency side and higher frequency side of the pass band. Further, controlling the respective variable reactance elements of the serial arm and the parallel arm makes it possible to perform frequency adjustment on the pass band and the two attenuation poles, whereby band pass filter characteristics can be obtained in which the center frequency and the band width of the pass band are variable.

The serial arm can have a configuration in which the series reactance element is connected in series to a parallel circuit of the variable reactance element and the parallel reactance element.

With this configuration, in the bandpass characteristic of the serial arm as a single body, attenuation gradually increases in a neighborhood frequency band on a higher frequency side of the pass band as the frequency is further distanced from the pass band. This makes it possible to secure large attenuation in a wide frequency band on the higher frequency side relative to the pass band in the bandpass characteristic of the overall variable filter circuit.

The parallel arm can have a configuration in which the parallel reactance element is connected in parallel to a series circuit of the variable reactance element and the series reactance element.

With this configuration, in the bandpass characteristic of the parallel arm as a single body, attenuation gradually increases in a neighborhood frequency band on a lower frequency side of the pass band as the frequency is further distanced from the pass band. This makes it possible to secure large attenuation in a wide frequency band on the lower frequency side relative to the pass band in the bandpass characteristic of the overall variable filter.

The variable reactance element can be a variable capacitance element, and that the series reactance element and the parallel reactance element can be inductors.

With this configuration, each of the variable reactance element, series reactance element, and parallel reactance element can be obtained using a relatively small size element, thereby making it possible to miniaturize the circuit as a whole.

The variable filter circuit can include a first serial arm having the same configuration as the above-discussed serial arm and a second serial arm having the same configuration as the above-discussed serial arm that are respectively connected to both sides of the parallel arm, and that an inductor as the parallel reactance element of the first serial arm and an inductor as the parallel reactance element of the second serial arm can be connected by magnetic field coupling.

With this configuration, a frequency of parallel resonance of the serial arm can be moved toward a lower frequency side by the magnetic field coupling without necessarily increasing inductance of the inductor. Through this, steepness performance and attenuation performance can be further enhanced while preventing an increase in loss.

The variable filter circuit can include a first parallel arm having the same configuration as the above-discussed parallel arm and a second parallel arm having the same configuration as the above-discussed parallel arm that are respectively connected to both sides of the serial arm, and that an inductor as the series reactance element of the first parallel arm and an inductor as the series reactance element of the second parallel arm can be connected to each other by the magnetic field coupling.

With this configuration, a frequency of series resonance of the parallel arm can be moved toward a higher frequency side by the magnetic field coupling without necessarily increasing inductance of the inductor. Through this, the steepness performance and attenuation performance can be further enhanced while preventing an increase in loss.

The inductors connected by the magnetic field coupling can be chip components each having a first mounting terminal on a side where the chip component is connected to each other and a second mounting terminal on a side where the chip component is connected to circuit input/output portions, and that the first mounting terminals of the chip components and the second mounting terminals of the chip components can be respectively so arranged as to be close to each other.

With this configuration, the magnetic field coupling can be strengthened while suppressing influence of mutual capacitance of the two inductors connected to each other by the magnetic field coupling.

The variable filter circuit can further include a matching circuit that is provided at input/output ends of the aforementioned signal path and make normalized impedance approach substantially a value of 1 when viewed from the input/output end.

With this configuration, the bandpass characteristic of the variable filter circuit can be further improved while suppressing reflection of the signal at the input/output end of the variable filter circuit.

The variable filter circuit may include a plurality of the aforementioned serial arms. Further, the variable filter circuit may include a plurality of the aforementioned parallel arms.

With these configurations, characteristics of the plurality of serial arms, the plurality of parallel arms, and the like can be superposed, which makes it possible to further improve the bandpass characteristic of the variable filter circuit.

A high frequency module circuit according to the present disclosure includes the above-discussed variable filter circuit, an antenna tuner, a separation circuit configured to separate a transmission signal and a reception signal, a transmission filter that performs filtering on the transmission signal and outputs the signal having experienced the filtering to the separation circuit, and a reception filter that performs filtering on the reception signal separated by the separation circuit, wherein the variable filter circuit is disposed between the separation circuit and the antenna tuner. In this case, the high frequency module circuit can further include a power amplifier, and that the power amplifier amplifies a transmission signal and outputs the amplified signal to the transmission filter.

A communication device according to the present disclosure includes the above-discussed high frequency module circuit and an RFIC, wherein the RFIC outputs a transmission signal to the power amplifier.

According to the present disclosure, by configuring a variable filter circuit, which is capable of performing frequency adjustment on a center frequency and a band width of a pass band, using two variable reactance elements in total included in a minimum configuration unit, it is possible to provide the variable filter circuit, a high frequency module circuit, and a communication device in which frequency adjustment can be performed on the center frequency and band width of the pass band while reducing the total number of variable reactance elements compared to the existing technique and suppressing the circuit size, control complexity, and the like of the variable filter circuit.

DETAILED DESCRIPTION

First Embodiment

Figure 1:
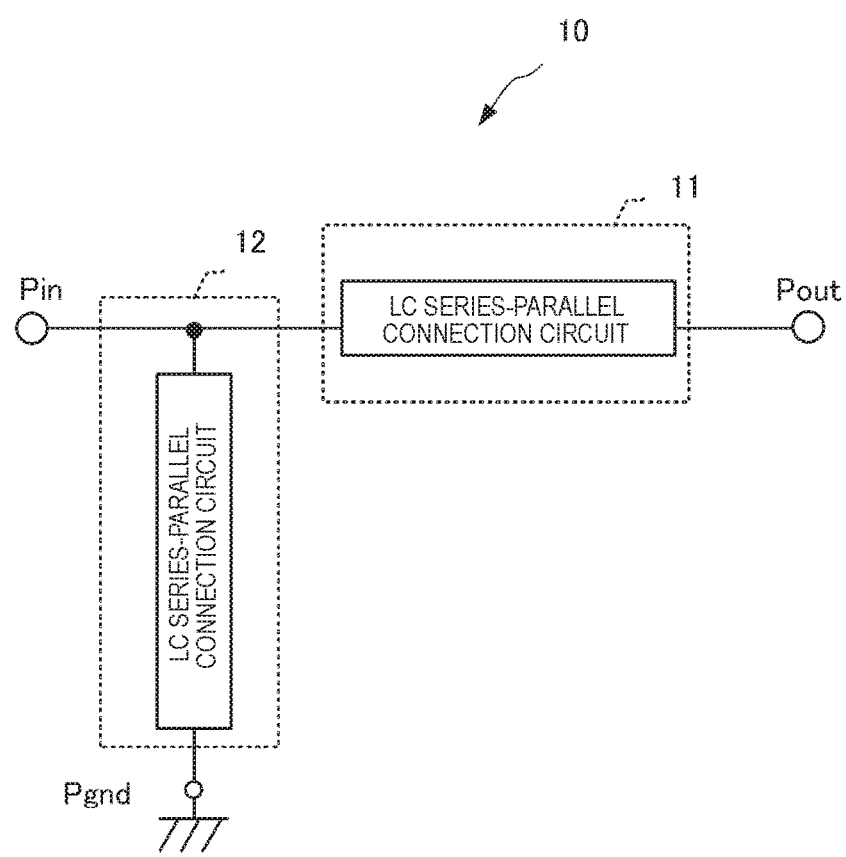
FIG. 1 is a circuit diagram of a variable filter circuit according to a first embodiment.

FIG. 1 is a circuit diagram illustrating a variable filter circuit 10 according to a first embodiment of the present disclosure.

The variable filter circuit 10 includes ports Pin, Pout, and Pgnd, a serial arm 11, and a parallel arm 12.

The port Pin is a signal input end of the variable filter circuit 10. The port Pout is a signal output end of the variable filter circuit 10. The port Pgnd is a ground connection end of the variable filter circuit 10.

The serial arm 11 and the parallel arm 12 are connected to a signal path between the port Pin and the port Pout in sequence. The serial arm 11 includes an LC series-parallel connection circuit inserted in series between the port Pin and the port Pout. The parallel arm 12 includes an LC series-parallel connection circuit connected in series between the port Pin and the port Pgnd.

The serial arm 11 and the parallel arm 12 each include a variable reactance element, a series reactance element that performs series resonance with the variable reactance element, and a parallel reactance element that performs parallel resonance with the variable reactance element; details of this will be explained later. In other words, both the serial arm 11 and the parallel arm 12 are so configured as to have a series resonance point and a parallel resonance point. As such, a bandpass characteristic of the serial arm 11 as a single body and a bandpass characteristic of the parallel arm 12 as a single body include a pass band and an attenuation pole on which frequency adjustment can be performed by controlling the variable reactance element.

Meanwhile, the bandpass characteristic of the overall variable filter circuit 10 refers to a bandpass characteristic in which the bandpass characteristic of the serial arm 11 as a single body and the bandpass characteristic of the parallel arm 12 as a single body are superposed. More specifically, a frequency band where the pass band of the parallel arm 12 overlaps with the pass band of the serial arm 11 becomes a pass band of the overall variable filter circuit 10. Further, a frequency band overlapping with the attenuation pole of the serial arm 11 and a frequency band overlapping with the attenuation pole of the parallel arm 12 respectively become attenuation poles of the variable filter circuit 10.

Accordingly, the variable filter circuit 10 according to the present embodiment has a pass band and two attenuation poles in the bandpass characteristic thereof, and is capable of performing frequency adjustment on the pass band and the two attenuation poles by controlling each of the two variable reactance elements in total provided in the serial arm 11 and the parallel arm 12.

Working Example 1

Hereinafter, a more detailed working example of the variable filter circuit 10 will be described.

Figure 2A:
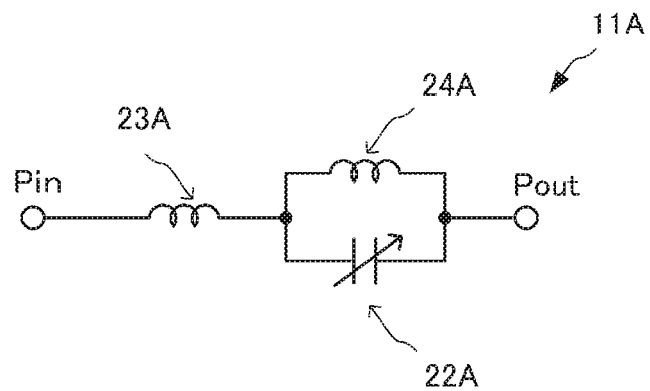
FIGS. 2A and 2B include a circuit diagram and a characteristic graph of a serial arm according to Working Example 1.

FIG. 2A is a circuit diagram of a serial arm 11A according to Working Example 1 of the variable filter circuit 10.

In this working example, the serial arm 11A includes a variable capacitance element 22A, a series inductor 23A, and a parallel inductor 24A. The variable capacitance element 22A has a variable capacitive reactance value. The parallel inductor 24A is connected in parallel to the variable capacitance element 22A, and has inductive reactance which resonates with the capacitive reactance of the variable capacitance element 22A. The series inductor 23A is connected in series to a parallel circuit of the parallel inductor 24A and the variable capacitance element 22A, and has the inductive reactance which resonates with the capacitive reactance of the variable capacitance element 22A. The parallel inductor 24A, the variable capacitance element 22A, and the series inductor 23A are respectively connected in series with respective to a signal path between input/output ends of the variable filter circuit 10.

Figure 2B:
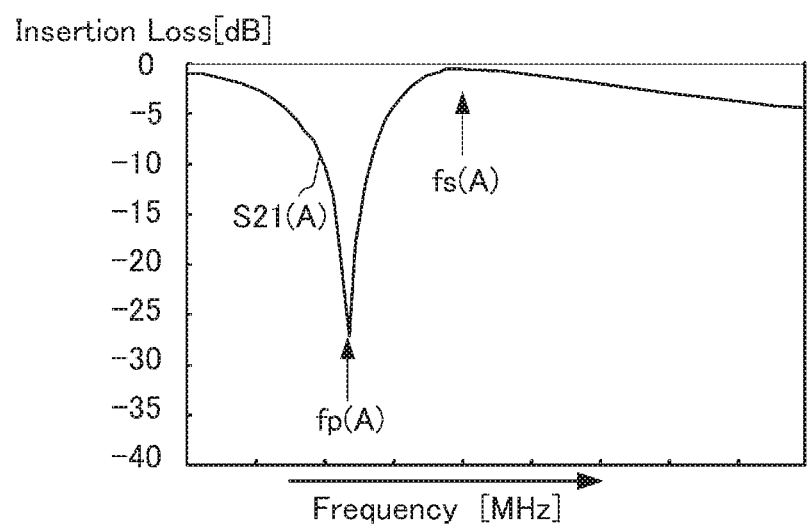

FIG. 2B is a characteristic graph exemplifying a bandpass characteristic S21(A) of the serial arm 11A as a single body.

In the serial arm 11A, a parallel resonant frequency fp(A) of the variable capacitance element 22A and the parallel inductor 24A is positioned on a lower frequency side relative to a series resonant frequency fs(A) of the variable capacitance element 22A and the series inductor 23A. Further, attenuation is suppressed at the series resonant frequency fs(A) positioned on a higher frequency side so that a pass band is formed in a neighborhood frequency band of the series resonant frequency fs(A). Furthermore, a passing-through amount of the signal is minimized at the parallel resonant frequency fp(A) positioned on the lower frequency side so that an attenuation pole is formed at the parallel resonant frequency fp(A). As such, in the bandpass characteristic S21(A), frequency adjustment can be performed on the series resonant frequency fs(A) and the pass band as well as the parallel resonant frequency fp(A) and the attenuation pole by controlling the variable capacitance element 22A.

Figure 3A:
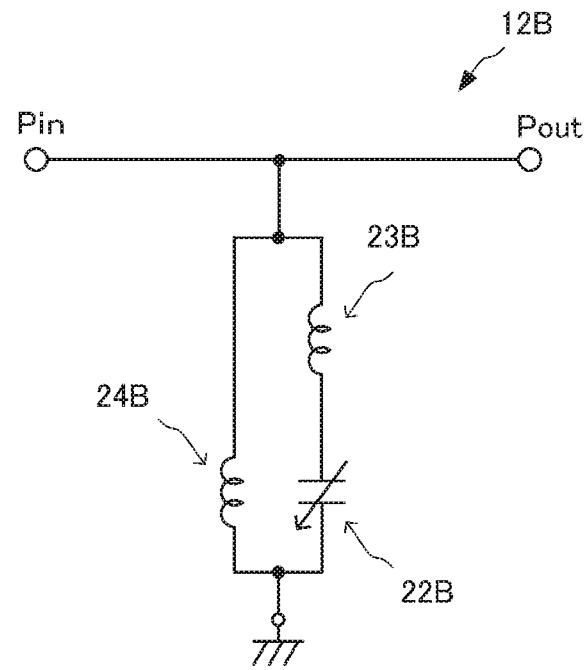
FIGS. 3A and 3B include a circuit diagram and a characteristic graph of a parallel arm according to Working Example 1.

FIG. 3A is a circuit diagram of a parallel arm 12B according to Working Example 1 of the variable filter circuit 10.

In this working example, the parallel arm 12B includes a variable capacitance element 22B, a series inductor 23B, and a parallel inductor 24B. The variable capacitance element 22B has a variable capacitive reactance value. The series inductor 23B is connected in series to the variable capacitance element 22B, and has the inductive reactance which resonates with the capacitive reactance of the variable capacitance element 22B. The parallel inductor 24B is connected in parallel to a series circuit of the series inductor 23B and the variable capacitance element 22B, and has the inductive reactance which resonates with the capacitive reactance of the variable capacitance element 22B. The variable capacitance element 22B, the series inductor 23B, and the parallel inductor 24B are respectively connected in parallel with respect to the signal path between the input/output ends of the variable filter circuit 10.

Figure 3B:
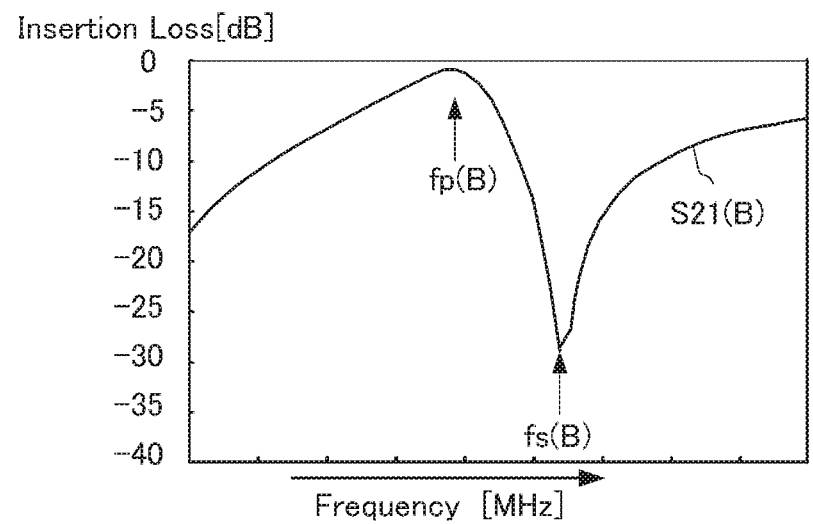

FIG. 3B is a characteristic graph exemplifying a bandpass characteristic S21(B) of the parallel arm 12B as a single body.

In the parallel arm 12B, a parallel resonant frequency fp(B) of the variable capacitance element 22B and the parallel inductor 24B is positioned on a lower frequency side relative to a series resonant frequency fs(B) of the variable capacitance element 22B and the series inductor 23B. Further, attenuation is suppressed at the parallel resonant frequency fp(B) positioned on the lower frequency side so that a pass band is formed in a neighborhood frequency band of the parallel resonant frequency fp(B). Furthermore, a passing-through amount of the signals is minimized at the series resonant frequency fs(B) positioned on a higher frequency side so that an attenuation pole is formed at the series resonant frequency fs(B). As such, in the bandpass characteristic S21(B), frequency adjustment can be performed on the parallel resonant frequency fp(B) and the pass band as well as the series resonant frequency fs(B) and the attenuation pole by controlling the variable capacitance element 22B.

Because the serial arm 11A and the parallel arm 12B according to above Working Example 1 are inserted in the signal path of the variable filter circuit 10 in sequence, the bandpass characteristic of the overall variable filter circuit 10 is such a bandpass characteristic that is obtained by superposing the bandpass characteristic of the serial arm 11A and the bandpass characteristic of the parallel arm 12B.

Figure 4A:
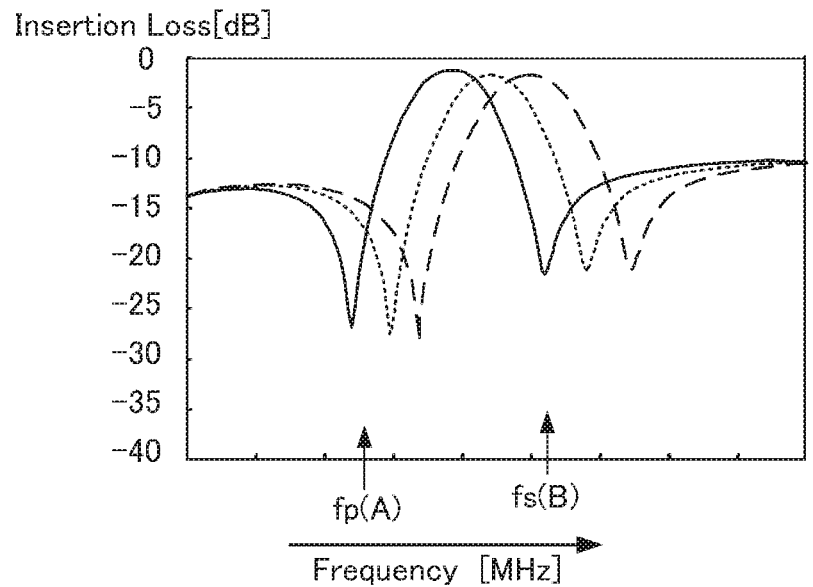
FIGS. 4A and 4B include characteristic graphs of a variable filter circuit according to Working Example 1.
Figure 4B:
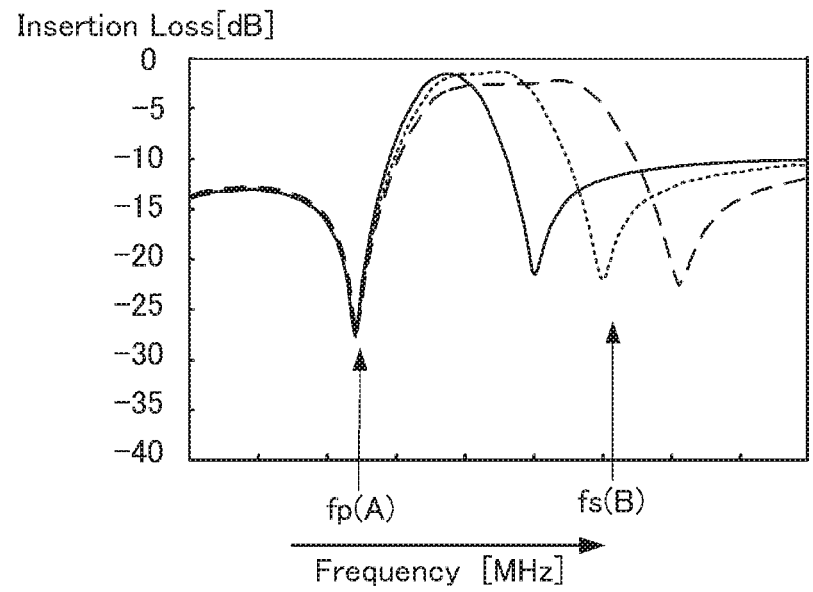

FIG. 4A and FIG. 4B are characteristic graphs exemplifying bandpass characteristics of the variable filter circuit 10 in the case where the serial arm 11A and the parallel arm 12B according to Working Example 1 are used.

In the bandpass characteristic of the variable filter circuit 10, a pass band is formed in a frequency band where the pass band of the serial arm 11A overlaps with the pass band of the parallel arm 12B. Further, a first attenuation pole of the variable filter circuit 10 is formed at the frequency fp(A) on a lower frequency side of the pass band by the serial arm 11A and a second attenuation pole of the variable filter circuit 10 is formed at the frequency fs(B) on a higher frequency side of the pass band by the parallel arm 12B.

The pass band of the variable filter circuit 10 is formed on a higher frequency side relative to the frequency fp(A) at which the attenuation pole is formed by the serial arm 11A and on a lower frequency side relative to the frequency fs(B) at which the attenuation pole is formed by the parallel arm 12B. As such, in the bandpass characteristic of the overall variable filter circuit 10, attenuation poles are formed on both a lower frequency side and a higher frequency side of the pass band so that a band pass filter characteristic having steep attenuation characteristics at both the lower frequency side and higher frequency side of the pass band can be obtained. Moreover, in the pass band of the variable filter circuit 10, by the total of two variable capacitance elements 22A and 22B being controlled respectively, frequency adjustment can be independently performed on a cutoff frequency and the attenuation pole on the higher frequency side of the pass band as well as a cutoff frequency and the attenuation pole on the lower frequency side of the pass band. Accordingly, the center frequency and the band width of the pass band of the variable filter circuit 10 can be controlled.

For example, the parallel resonant frequency fp(A) of the serial arm 11A and the series resonant frequency fs(B) of the parallel arm 12B are adjusted, while maintaining a frequency adjustment width to be the same, by controlling the variable capacitance element 22A of the serial arm 11A and the variable capacitance element 22B of the parallel arm 12B, respectively. As a result, as shown in FIG. 4A, in the bandpass characteristic of the overall variable filter circuit 10, the cutoff frequency and attenuation pole on the lower frequency side of the pass band as well as the cutoff frequency and attenuation pole on the higher frequency side of the pass band can be shifted in the same frequency direction with the same frequency adjustment width. In this manner, the center frequency of the pass band can be changed without necessarily changing the band width of the pass band.

Further, by controlling not the variable capacitance element 22A of the serial arm 11A but only the variable capacitance element 22B of the parallel arm 12B, frequency adjustment is performed on the series resonant frequency fs(B) of the parallel arm 12B without necessarily changing the parallel resonant frequency fp(A) of the serial arm 11A. As a result, as shown in FIG. 4B, in the bandpass characteristic of the overall variable filter circuit 10, frequency adjustment can be performed on the cutoff frequency and attenuation pole on the higher frequency side of the pass band without necessarily changing the cutoff frequency and attenuation pole on the lower frequency side of the pass band. In this manner, the pass band can have a desired band width.

Working Example 2

Figure 5A:
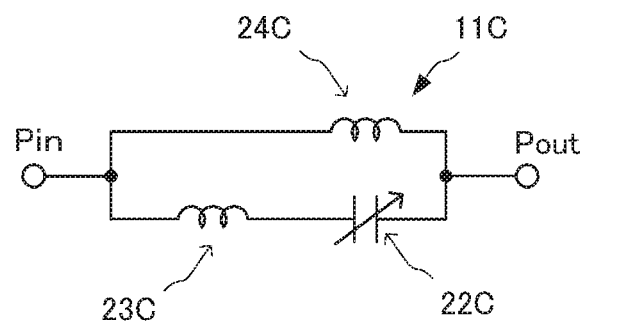
FIGS. 5A and 5B include a circuit diagram of a serial arm and a circuit diagram of a parallel arm according to Working Example 2.

FIG. 5A is a circuit diagram of a serial arm 11C according to Working Example 2 of the variable filter circuit 10.

In this working example, the serial arm 11C includes a variable capacitance element 22C, a series inductor 23C, and a parallel inductor 24C. The variable capacitance element 22C has a variable capacitive reactance value. The series inductor 23C is connected in series to the variable capacitance element 22C, and has the inductive reactance which resonates with the capacitive reactance of the variable capacitance element 22C. The parallel inductor 24C is connected in parallel to a series circuit of the variable capacitance element 22C and the series inductor 23C, and has the inductive reactance which resonates with the capacitive reactance of the variable capacitance element 22C. The parallel inductor 24C, the variable capacitance element 22C, and the series inductor 23C are respectively connected in series with respect to the signal path between the input/output ends of the variable filter circuit 10.

Figure 5B:
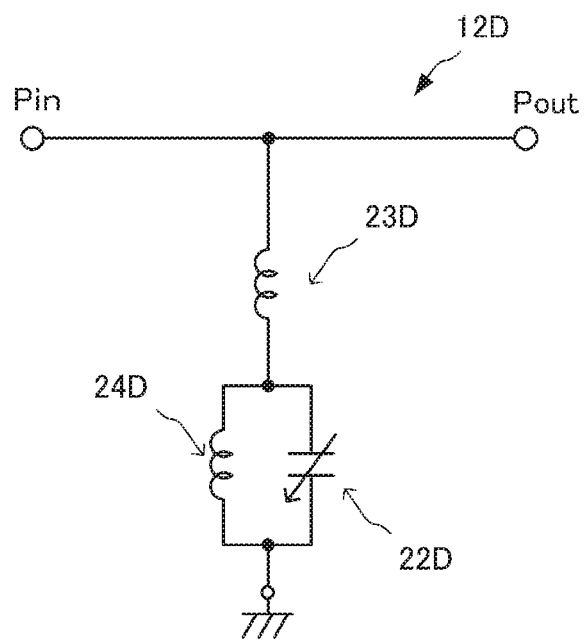

FIG. 5B is a circuit diagram of a parallel arm 12D according to Working Example 2 of the variable filter circuit 10.

In this working example, the parallel arm 12D includes a variable capacitance element 22D, a series inductor 23D, and a parallel inductor 24D. The variable capacitance element 22D has a variable capacitive reactance value. The parallel inductor 24D is connected in parallel to the variable capacitance element 22D, and has the inductive reactance which resonates with the capacitive reactance of the variable capacitance element 22D. The series inductor 23D is connected in series to a parallel circuit of the variable capacitance element 22D and the parallel inductor 24D, and has the inductive reactance which resonates with the capacitive reactance of the variable capacitance element 22D. The parallel inductor 24D, the variable capacitance element 22D, and the series inductor 23D are respectively connected in parallel with respect to the signal path between the input/output ends of the variable filter circuit 10.

Figure 6A:
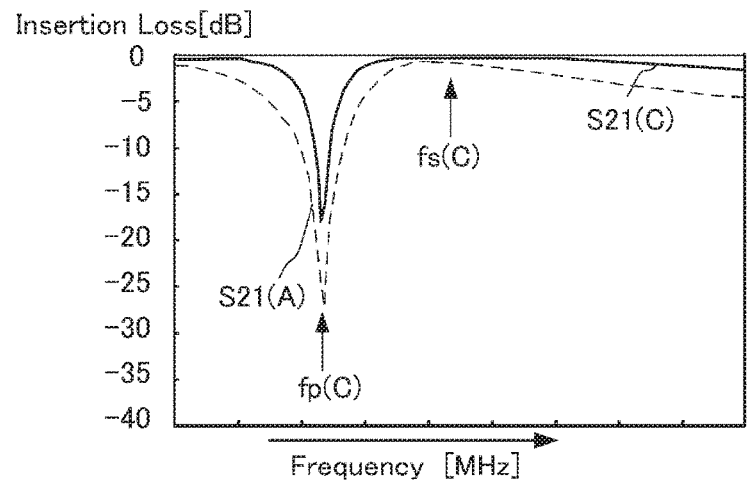
FIGS. 6A-6C include characteristic graphs of the serial arm, the parallel arm, and a variable filter circuit according to Working Example 2.

FIG. 6A is a characteristic graph exemplifying a bandpass characteristic S21(C) of the serial arm 11C as a single body. Note that in FIG. 6A, the bandpass characteristic S21(A) of the serial arm 11A according to Working Example 1 is also illustrated for comparison.

In the serial arm 11C, like in the serial arm 11A of Working Example 1, a parallel resonant frequency fp(C) of the variable capacitance element 22C and the parallel inductor 24C is positioned on a lower frequency side relative to a series resonant frequency fs(C) of the variable capacitance element 22C and the series inductor 23C. As such, a pass band is formed in a neighborhood frequency band of the series resonant frequency fs(C) positioned on a higher frequency side, and an attenuation pole is formed at the parallel resonant frequency fp(C) positioned on the lower frequency side. Accordingly, in the bandpass characteristic S21(A), frequency adjustment can be performed, by controlling the variable capacitance element 22C, on the series resonant frequency fs(C) and the pass band on the higher frequency side as well as the parallel resonant frequency fp(C) and the attenuation pole on the lower frequency side.

Figure 6B:
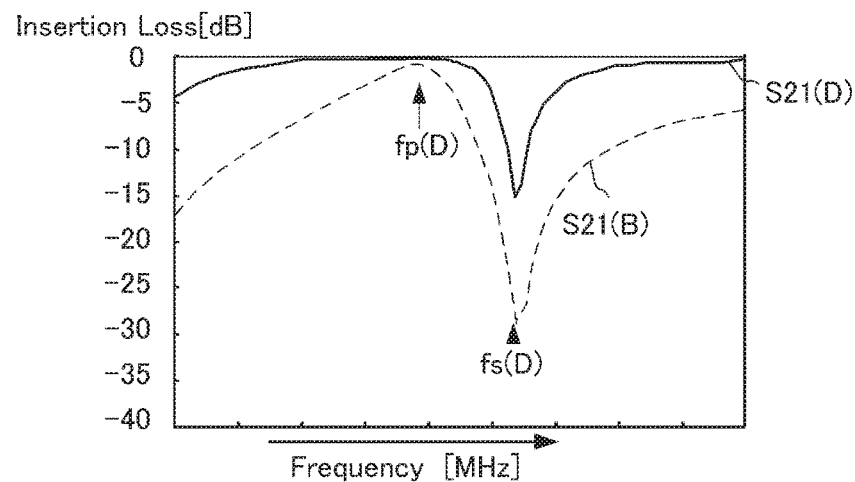

FIG. 6B is a characteristic graph exemplifying a bandpass characteristic S21(D) of the parallel arm 12D as a single body. Note that in FIG. 6B, the bandpass characteristic S21(B) of the parallel arm 12B according to Working Example 1 is also illustrated for comparison.

In the parallel arm 12D, like in the parallel arm 12B of Working Example 1, a parallel resonant frequency fp(D) of the variable capacitance element 22D and the parallel inductor 24D is positioned on a lower frequency side relative to a series resonant frequency fs(D) of the variable capacitance element 22D and the series inductor 23D. As such, a pass band is formed in a neighborhood band of the parallel resonant frequency fp(D) positioned on the lower frequency side, and an attenuation pole is formed at the series resonant frequency fs(D) positioned on a higher frequency side. Accordingly, in the bandpass characteristic S21(D), frequency adjustment can be performed, by controlling the variable capacitance element 22D, on the series resonant frequency fs(D) and the attenuation pole on the higher frequency side as well as the parallel resonant frequency fp(D) and the pass band on the lower frequency side.

Figure 6C:
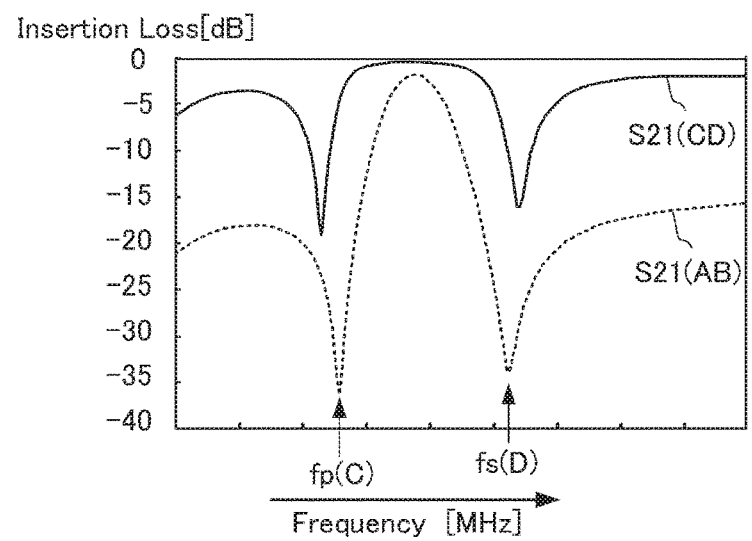

FIG. 6C is a characteristic graph exemplifying a bandpass characteristic S21(CD) of the variable filter circuit 10 in the case where the serial arm 11C and the parallel arm 12D according to Working Example 2 are used. Note that in FIG. 6C, the bandpass characteristic S21(AB) of the variable filter circuit 10 according to Working Example 1 is also illustrated for comparison.

In the bandpass characteristic S21(CD) according to Working Example 2, a pass band is formed in a frequency band where the pass band of the serial arm 11C overlaps with the pass band of the parallel arm 12D. Further, a first attenuation pole of the variable filter circuit 10 is formed at the frequency fp(C) on a lower frequency side of the pass band by the serial arm 11C, and a second attenuation pole of the variable filter circuit 10 is formed at the frequency fs(D) on a higher frequency side of the pass band by the parallel arm 12D. Therefore, also in this Working Example 2, steep attenuation characteristics can be obtained at both the lower frequency side and higher frequency side of the pass band.

Moreover, by the total of two variable capacitance elements 22C and 22D being controlled respectively, frequency adjustment can be independently performed on a cutoff frequency and the attenuation pole on the higher frequency side of the pass band as well as a cutoff frequency and the attenuation pole on the lower frequency side of the pass band, whereby the center frequency and the band width of the pass band of the variable filter circuit 10 can be controlled.

In the case where the bandpass characteristic S21(CD) according to Working Example 2 and the bandpass characteristic S21(AB) according to Working Example 1 are compared with each other, a minimum value of the insertion loss in the bandpass characteristic S21(CD) according to Working Example 2 is smaller than that in the bandpass characteristic S21(AB) according to Working Example 1 in the pass band sandwiched between the two attenuation poles. In contrast, attenuation performance in each of the frequency bands outside the pass band on a higher frequency side and a lower frequency side of the pass band is more excellent in the bandpass characteristic S21(AB) according to Working Example 1 than that in the bandpass characteristic S21(CD) according to Working Example 2. Therefore, in the variable filter circuit 10, the configuration according to Working Example 2 from the standpoint of suppressing insertion loss in the pass band can be employed, and the configuration according to Working Example 1 from the standpoint of broadly securing attenuation performance in the frequency bands outside the pass band can be employed.

Working Example 3

Figure 7A:
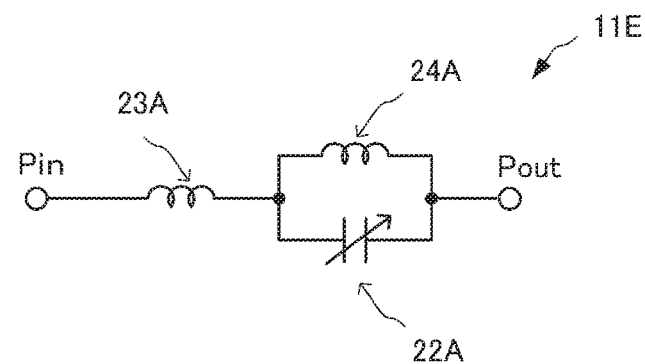
FIGS. 7A-7C include a circuit diagram of a serial arm, a circuit diagram of a parallel arm, and a characteristic graph of a variable filter circuit according to Working Example 3.
Figure 7B:
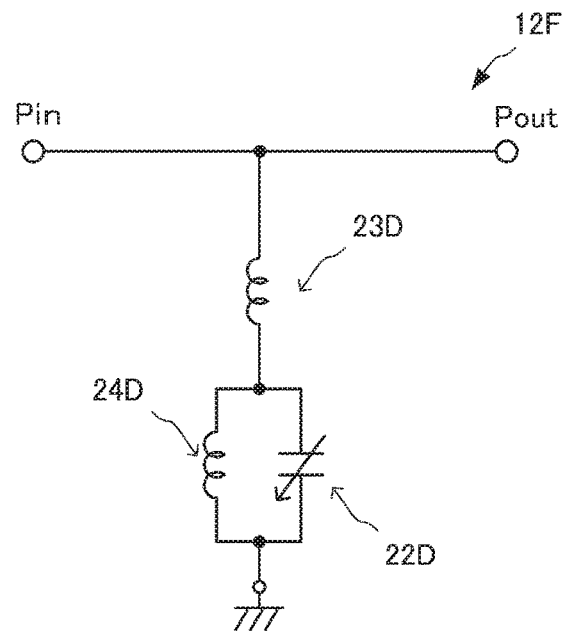

FIG. 7A is a circuit diagram of a serial arm 11E according to Working Example 3 of the variable filter circuit 10. FIG. 7B is a circuit diagram of a parallel arm 12F according to Working Example 3 of the variable filter circuit 10. The serial arm 11E has the same configuration as the serial arm 11A according to Working Example 1 shown in FIG. 2A. The parallel arm 12F has the same configuration as the parallel arm 12D according to Working Example 2 shown in FIG. 5B.

Figure 7C:
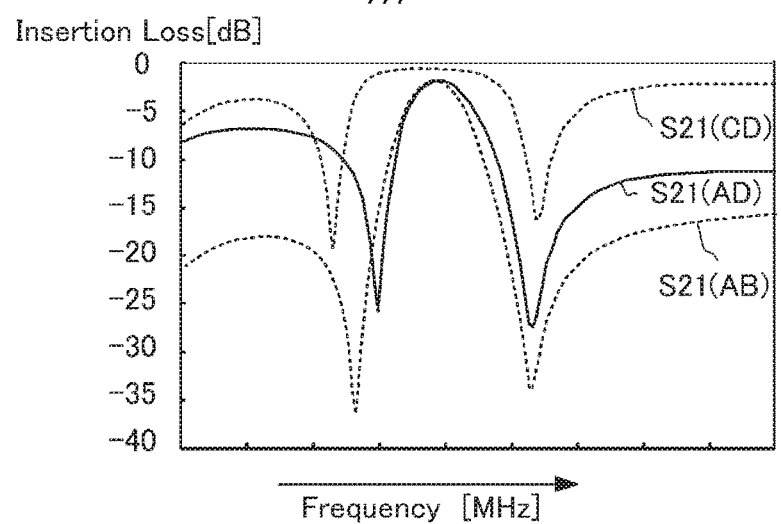

FIG. 7C is a characteristic graph exemplifying a bandpass characteristic S21 (AD) of the variable filter circuit 10 in the case where the serial arm 11E and the parallel arm 12F according to Working Example 3 are used. Note that in FIG. 7C, the bandpass characteristic S21(AB) of the variable filter circuit 10 according to Working Example 1 and the bandpass characteristic S21(CD) of the variable filter circuit 10 according to Working Example 2 are also illustrated for comparison.

Also in the bandpass characteristic S21(AD) of the variable filter circuit 10 according to Working Example 3, a band pass characteristic in which an attenuation pole is formed at a neighborhood frequency on a lower frequency side of the pass band and another attenuation pole is formed at a neighborhood frequency on a higher frequency side of the pass band can be obtained. As such, controlling variable capacitance elements 22A and 22D respectively provided in the serial arm 11E and the parallel arm 12F makes it possible to adjust the center frequency and the band width of the pass band.

Further, in the bandpass characteristic S21(AD) according to Working Example 3 and the bandpass characteristic S21(AB) according to Working Example 1, attenuation performance is significantly improved in a frequency band leaving from the pass band toward a higher frequency side in comparison with the bandpass characteristic S21(CD)

according to Working Example 2. Because of this, in the variable filter circuit 10, from the standpoint of obtaining a sufficiently broad attenuation in the frequency band on the higher frequency side relative to the pass band, a configuration common to Working Example 1 and Working Example 3, that is, a configuration in which a series inductor 23A is connected in series to a parallel circuit of the variable capacitance element 22A and a parallel inductor 24A can be employed in the serial arm 11.

Working Example 4

Figure 8A:
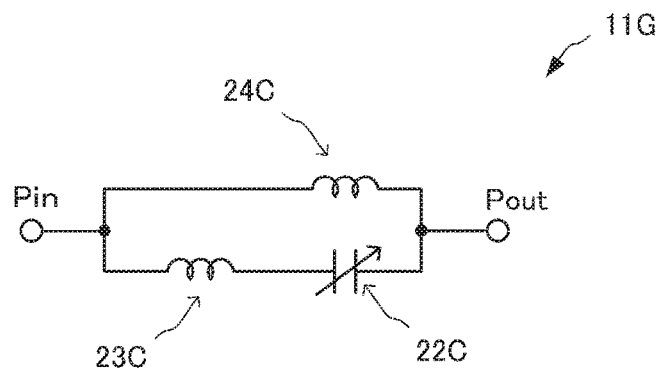
FIGS. 8A-8C include a circuit diagram of a serial arm, a circuit diagram of a parallel arm, and a characteristic graph of a variable filter circuit according to Working Example 4.
Figure 8B:
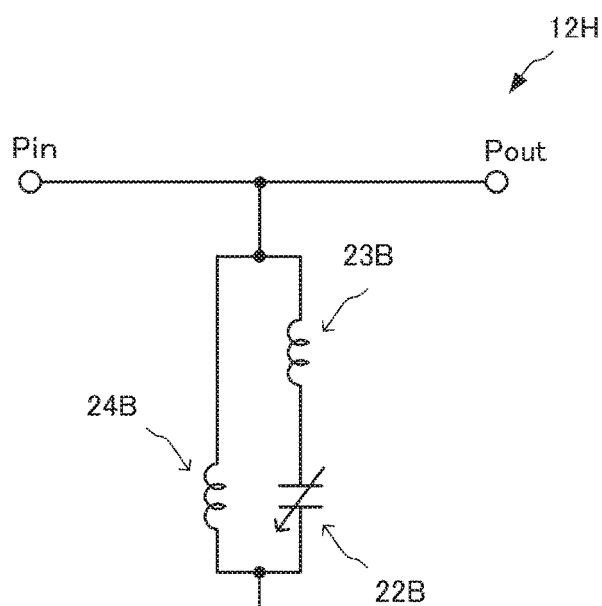

Next, Working Example 4 of the variable filter circuit 10 will be described. FIG. 8A is a circuit diagram of a serial arm 11G according to Working Example 4 of the variable filter circuit 10. FIG. 8B is a circuit diagram of a parallel arm 12H according to Working Example 4 of the variable filter circuit 10. The serial arm 11G has the same configuration as the serial arm 11C according to Working Example 2 shown in FIG. 5A. The parallel arm 12H has the same configuration as the parallel arm 12B according to Working Example 1 shown in FIG. 3A.

Figure 8C:
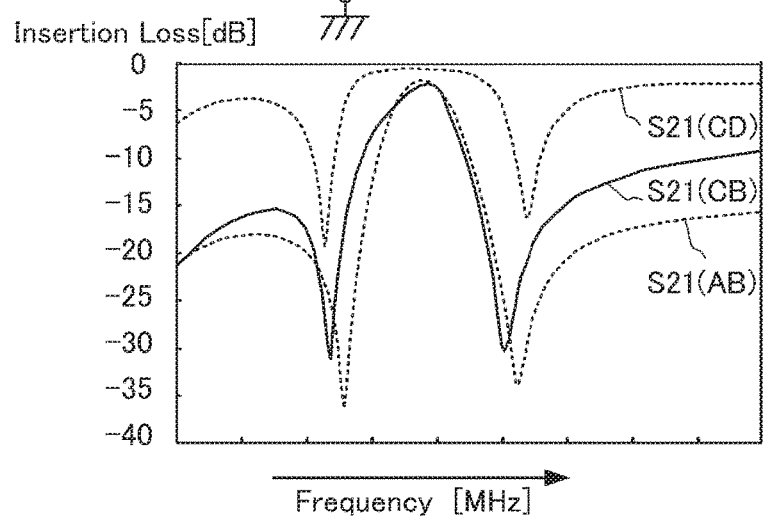

FIG. 8C is a characteristic graph exemplifying a bandpass characteristic S21(CB) of the variable filter circuit 10 in the case where the serial arm 11G and the parallel arm 12H according to Working Example 4 are used. Note that in FIG. 8C, the bandpass characteristic S21(AB) of the variable filter circuit 10 according to Working Example 1 and the bandpass characteristic S21(CD) of the variable filter circuit 10 according to Working Example 2 are also illustrated for comparison.

Also in the bandpass characteristic S21(CB) of the variable filter circuit 10 according to Working Example 4, a band pass characteristic in which an attenuation pole is formed at a neighborhood frequency on a lower frequency side of the pass band and another attenuation pole is formed at a neighborhood frequency on a higher frequency side of the pass band can be obtained. As such, controlling the variable capacitance elements 22C and 22B respectively provided in the serial arm 11G and the parallel arm 12H makes it possible to adjust the center frequency and the band width of the pass band.

Further, in the bandpass characteristic S21(CB) according to Working Example 4 and the bandpass characteristic S21(AB) according to Working Example 1, attenuation performance is significantly improved in a frequency band leaving from the pass band toward a lower frequency side in comparison with the bandpass characteristic S21(CD) according to Working Example 2. Because of this, in the variable filter circuit 10, from the standpoint of obtaining a sufficiently broad attenuation in a frequency band leaving from the pass band toward a lower frequency side, a configuration common to Working Example 1 and Working Example 4, that is, a configuration in which a parallel inductor is connected in parallel to a series circuit of a variable capacitance element and a series inductor can be employed in the parallel arm 12.

Second Embodiment

Figure 9:
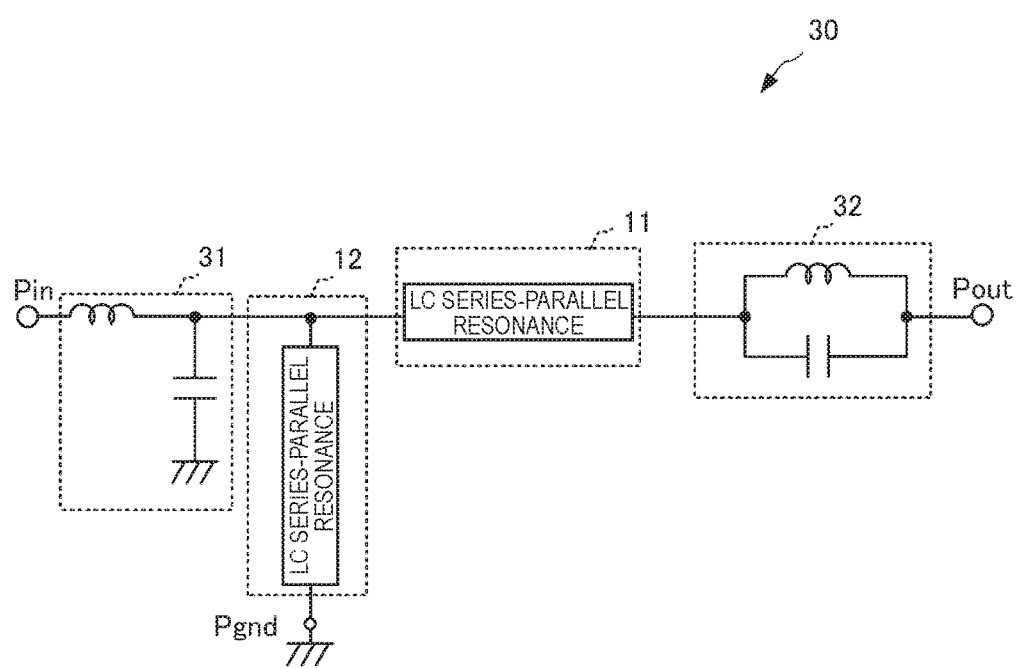
FIG. 9 is a circuit diagram of a variable filter circuit according to a second embodiment.

Next, a variable filter circuit according to a second embodiment of the present disclosure will be described. FIG. 9 is a circuit diagram of a variable filter circuit 30 according to the second embodiment of the present disclosure.

The variable filter circuit 30 includes a serial arm 11, a parallel arm 12, an input stage matching circuit 31, and an output stage matching circuit 32. The serial arm 11 and the parallel arm 12 have the same configurations as those of the first embodiment. The input stage matching circuit 31 is provided between the parallel arm 12 and the input port Pin. The input stage matching circuit 31 has a function to make normalized impedance of the variable filter circuit 30 approach a value of 1 when viewed from the input port Pin. The output stage matching circuit 32 is provided between the serial arm 11 and the output port Pout. The output stage matching circuit 32 has a function to make normalized impedance of the variable filter circuit 30 approach a value of 1 when viewed from the output port Pout. Note that the output stage matching circuit 32 is so configured as to be an LC parallel resonance circuit as well, thereby also having a function to form an attenuation pole that is fixed to a specific frequency in the bandpass characteristic of the variable filter circuit 30.

The variable filter circuit 30 according to the present embodiment can suppress reflection at the input port Pin and the output port Pout by including the input stage matching circuit 31 and the output stage matching circuit 32 as discussed above, which makes it possible to obtain a more favorable bandpass characteristic.

Third Embodiment

Figure 10A:
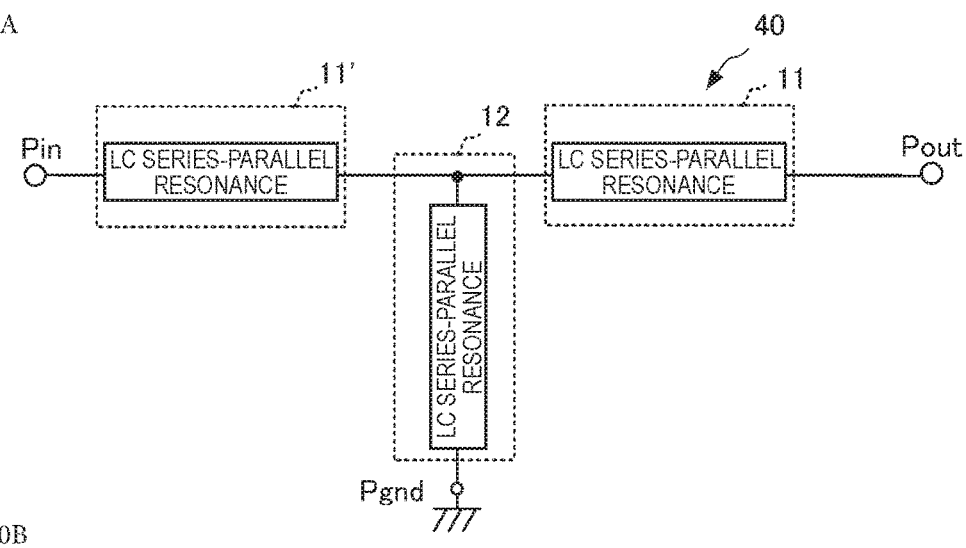
FIGS. 10A and 10B include a circuit diagram and a characteristic graph of a variable filter circuit according to a third embodiment.

Next, a variable filter circuit according to a third embodiment of the present disclosure will be described. FIG. 10A is a circuit diagram of a variable filter circuit 40 according to the third embodiment of the present disclosure.

The variable filter circuit 40 has a T-type circuit configuration including serial arms 11, 11' and a parallel arm 12. The serial arm 11 and the parallel arm 12 have the same configurations as those of the first embodiment. The serial arm 11' has the same configuration as the serial arm 11, and is provided between the parallel arm 12 and the input port Pin. Like this variable filter circuit 40, a variable filter circuit of the present disclosure can also be configured by including a plurality of serial arms.

Figure 10B:
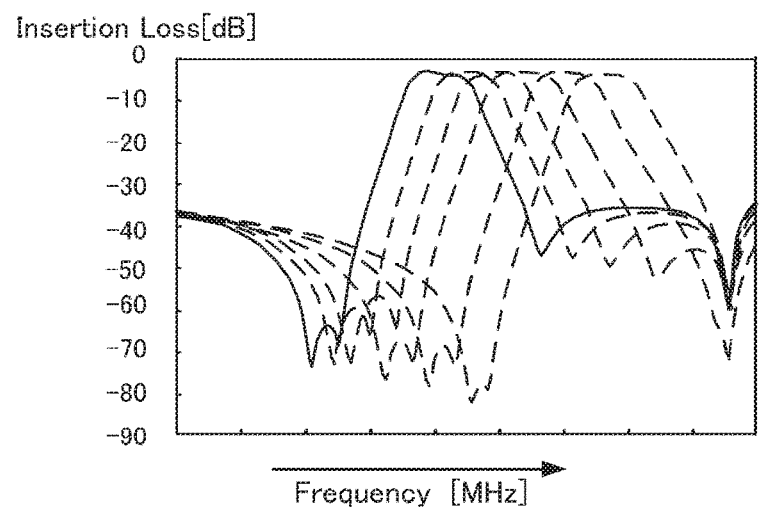

FIG. 10B is a characteristic graph exemplifying a bandpass characteristic of the variable filter circuit 40. Including a plurality of serial arms like the variable filter circuit 40 makes it possible to secure larger attenuation in a frequency band outside the pass band while maintaining the circuit being compact in size.

<<Variation>>

A case in which parallel inductors of the serial arms 11 and 11' are connected to each other by the magnetic field coupling in the T-type circuit configuration of the third embodiment will be described. Hereinafter, a variable filter circuit having the T-type circuit configuration in which the magnetic field coupling is included is referred to as a "variable filter circuit 40'".

Figure 11A:
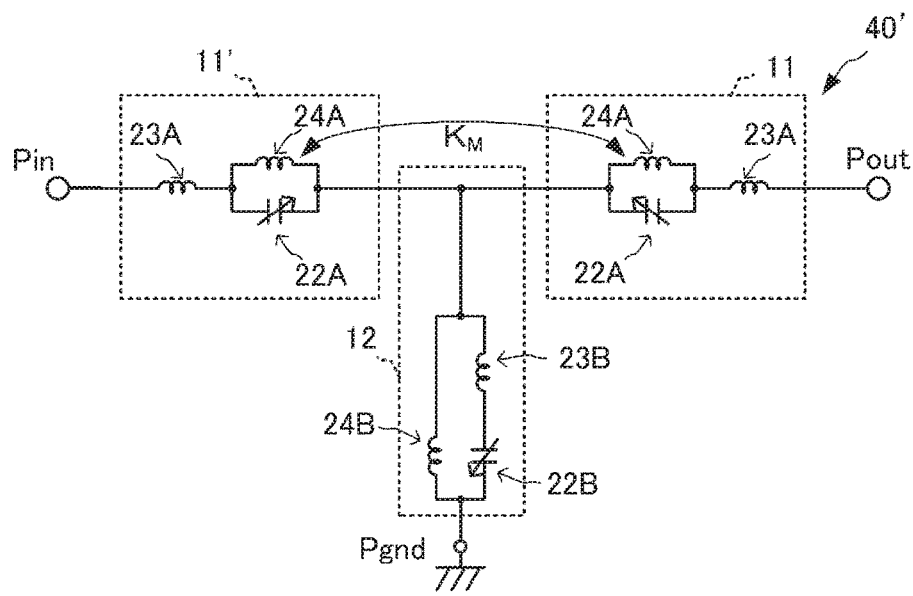
FIGS. 11A and 11B include a circuit diagram and a characteristic graph describing a case in which magnetic field coupling is generated between serial arms in the third embodiment.

FIG. 11A is a circuit diagram illustrating an example of a circuit configuration of the variable filter circuit 40'. The serial arms 11 and 11' each have the same circuit configuration as the serial arm 11A shown in FIG. 2A. A parallel arm 12 has the same circuit configuration as the parallel arm 12B shown in FIG. 3A.

In the variable filter circuit 40', the two serial arms 11 and 11' (a first serial arm and a second serial arm) each provided with a parallel inductor 24A are connected to both sides of the parallel arm 12 which is interposed between the serial arms 11 and 11'. One of the parallel inductors 24A overlaps a magnetic field generated by the other of the parallel inductors 24A while the other of the parallel inductors 24A overlaps a magnetic field generated by the one of the parallel inductors 24A, whereby these two parallel inductors 24A are connected to each other by the magnetic field coupling so as to increase the inductance of each of the parallel inductors 24A. This magnetic field coupling can be such that a magnetic field coupling coefficient $K_M$ satisfies a relation of $|K_M| \leq 0.1$, for example. Hereinafter, a case of $|K_M|=0.05$ will be described.

Figure 11B:
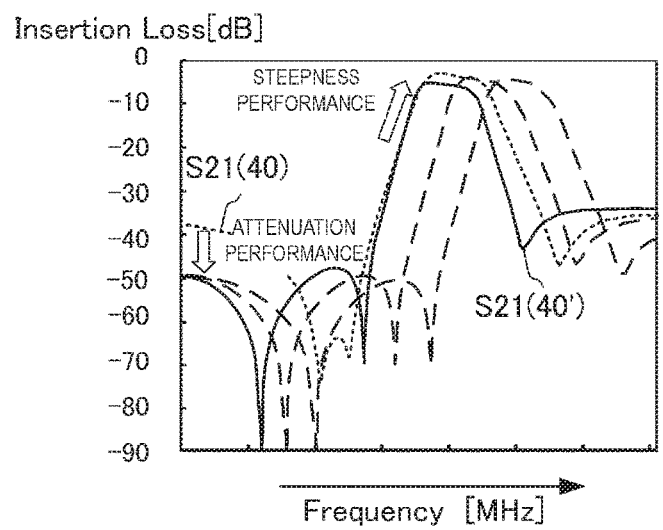

FIG. 11B is a characteristic graph exemplifying a bandpass characteristic S21(40') of the variable filter circuit 40'. Note that in FIG. 11B, a bandpass characteristic of the variable filter circuit 40' in the case where the center frequency is adjusted to move toward a higher frequency side is indicated by a broken line. Further, in FIG. 11B, a bandpass characteristic S21(40) of the variable filter circuit 40 representing a case of no magnetic field coupling is indicated by a dotted line for comparison.

Also in the bandpass characteristic S21(40') of the variable filter circuit 40' having the T-type circuit configuration in which the magnetic field coupling is included, a band pass characteristic in which an attenuation pole is formed at a neighborhood frequency on a lower frequency side of the pass band and another attenuation pole is formed at a neighborhood frequency on a higher frequency side of the pass band can be obtained. As such, controlling the variable capacitance elements 22A and 22B respectively provided in the serial arms 11, 11' and the parallel arm 12 makes it possible to adjust the center frequency and the band width of the pass band.

Further, in the variable filter circuit 40' having the T-type circuit configuration in which the magnetic field coupling is included, an attenuation pole produced by parallel resonance of the parallel inductor 24A and the variable capacitance element 22A can be shifted toward a lower frequency side by the magnetic field coupling without necessarily increasing a circuit constant of the parallel inductor 24A. Even if the above frequency shift is carried out, because the circuit constant of the parallel inductor 24A is not increased, an increase in loss by the parallel inductor 24A will not be caused, whereby attenuation performance, steepness performance, or the like in a frequency band outside the pass band of the variable filter circuit 40' can be improved.

In reality, also in an example shown in FIG. 11B, in the bandpass characteristic S21(40') of the T-type circuit configuration including the magnetic field coupling, attenuation performance in a frequency band leaving from the pass band toward a lower frequency side is significantly improved compared to the bandpass characteristic S21(40) of the T-type circuit configuration including no magnetic field coupling. Further, in the bandpass characteristic S21(40') of the T-type circuit configuration including the magnetic field coupling, steepness performance in a neighborhood frequency band on a lower frequency side of the pass band is significantly improved compared to the bandpass characteristic S21(40) of the T-type circuit configuration including no magnetic field coupling.

As discussed above, in the variable filter circuit having the T-type circuit configuration, in the case where the two serial arms 11 and 11' (the first serial arm and the second serial arm) are connected to both the sides of the parallel arm 12 which is interposed between the serial arms 11 and 11', connecting the parallel inductors 24A of the two serial arms 11 and 11' to each other by the magnetic field coupling makes it possible to improve the attenuation performance and the steepness performance in the frequency band outside the pass band without necessarily causing the circuit configuration to become large in size.

Hereinafter, a specific board layout of the variable filter circuit 40' for obtaining the above magnetic field coupling will be exemplified and explained.

Figure 12A:
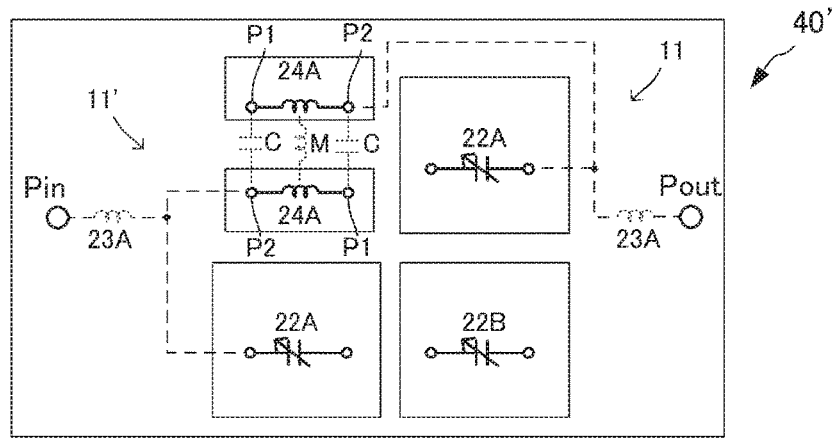
FIGS. 12A-12C include schematic diagrams illustrating configuration examples of circuit components, and a characteristic graph in the third embodiment.
Figure 12B:
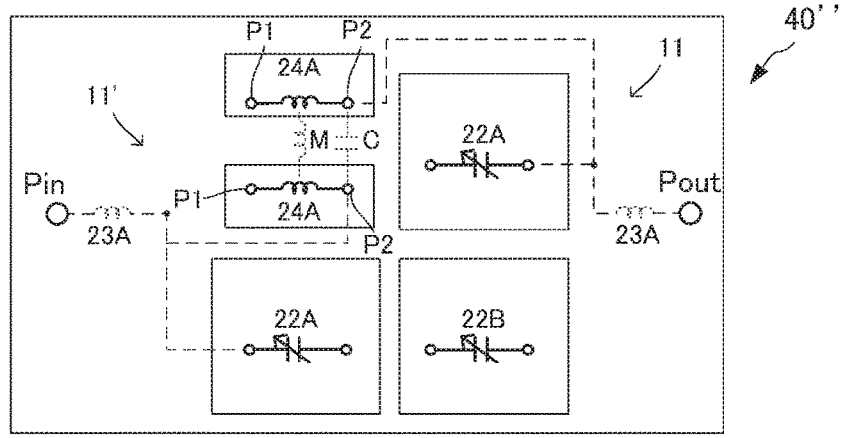
Figure 12C:
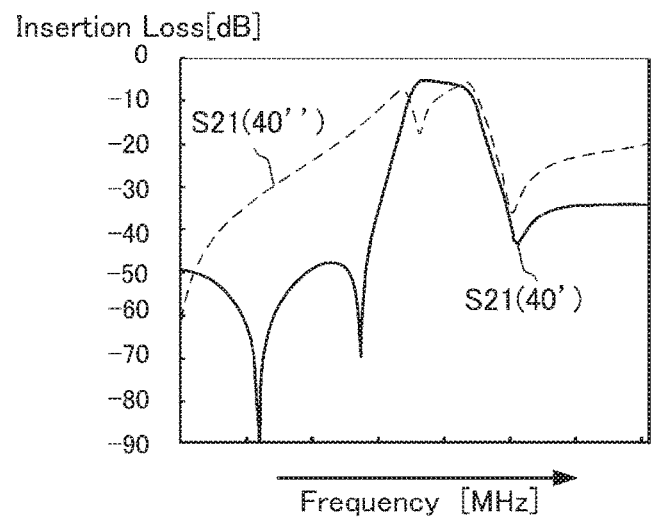

FIG. 12A is a schematic diagram illustrating an example of a board configuration of the variable filter circuit 40'. FIG. 12B is a schematic diagram illustrating an example of a board configuration of a variable filter circuit 40" which is a comparison target. FIG. 12C is a characteristic graph illustrating bandpass characteristics of the variable filter circuits 40' and 40".

In each of the variable filter circuits 40' and 40", the two variable capacitance elements 22A of the serial arms 11 and 11', the variable capacitance element 22B of the parallel arm 12, and the two parallel inductors 24A of the serial arms 11 and 11' are each configured as a chip component, and are surface-mounted on or incorporated in the board. Further, the two series inductors 23A of the serial arms 11 and 11' and the series inductor 23B (not shown) and the parallel inductor 24B (not shown) of the parallel arm 12 are each configured as a distributed constant (line) in or on the board.

In the case where the respective circuit components are given as discussed above, because the two parallel inductors 24A connected by the magnetic field coupling are configured with two chip components, Q-value of the parallel inductor 24A can be enhanced in comparison with a case in which these chips are each configured with a distributed constant. This makes it possible to enhance the effect of improvement in the steepness performance brought by connecting the two parallel inductors 24A by the magnetic field coupling.

In the case where the two parallel inductors 24A connected by the magnetic field coupling are configured with two chip components, the magnetic field coupling can be strengthened by arranging the stated chip components to be parallel and close to each other as much as possible. Note, however, in the case where the above-described arrangement is carried out, the chip components can be arranged in a reverse direction relative to each other.

To be specific, in each of the variable filter circuits 40' and 40", two chip components forming the two parallel inductors 24A of the serial arms 11 and 11' each include a first mounting terminal P1 and a second mounting terminal P2. The first mounting terminal P1 is a mounting terminal on a side where the two chip components forming the two parallel inductors 24A are connected to each other. The second mounting terminal P2 is a mounting terminal on a side where each of the two chip components forming the two parallel inductors 24A is connected to the port Pin or the port Pout.

In the variable filter circuit 40', the parallel inductor 24A of the serial arm 11 and the parallel inductor 24A of the serial arm 11' are arranged in a reverse direction relative to each other so that the first mounting terminal P1 and second mounting terminal P2 of the serial arm 11 are respectively adjacent to the second mounting terminal P2 and first mounting terminal P1 of the serial arm 11'. Meanwhile, in the variable filter circuit 40", the parallel inductor 24A of the serial arm 11 and the parallel inductor 24A of the serial arm 11' are arranged in the same direction so that the first mounting terminal P1 and second mounting terminal P2 of the serial arm 11 are respectively adjacent to the first mounting terminal P1 and second mounting terminal P2 of the serial arm 11'.

In both of the variable filter circuit 40' and the variable filter circuit 40", not only mutual inductance M is generated between the parallel inductors 24A, but also mutual capacitance C is generated between the mounting terminals P1, P2 adjacent to each other.

However, because each of the mutual capacitance C generated in the variable filter circuit 40' is generated between the mounting terminal P1 and the mounting terminal P2 of the two parallel inductors 24A, the mutual capacitance C is connected in parallel with respect to the parallel inductors 24A. In this case, since the mutual capacitance C affects the magnetic field coupling a little, attenuation performance and steepness performance on a lower frequency side of the pass band are improved as shown in FIG. 12C, like in the bandpass characteristic S21(40') indicated earlier in FIG. 11B.

On the other hand, because the mutual capacitance C generated in the variable filter circuit 40" is generated between the mounting terminals P2 of the two parallel inductors 24A, the mutual capacitance C is connected in parallel with respect to the mutual inductance M. In this case, since the mutual capacitance C largely affects the magnetic field coupling, the bandpass characteristic S21(40") is significantly degraded as shown in FIG. 12C.

Because of this, in the case where the two parallel inductors 24A are connected to each other by the magnetic field coupling, among the mounting terminals of the two parallel inductors 24A, the second mounting terminals P2 thereof on the port Pin and port Pout sides can be not close each other.

Other circuit elements provided as distributed constant circuits can be formed in portions distanced from the two chip components forming the two parallel inductors 24A so as to suppress the coupling with the parallel inductors 24A. Further, the above-mentioned other circuit elements may be so provided as to oppose the parallel inductors 24A while interposing therebetween a ground electrode provided inside the board, thereby suppressing the coupling with the parallel inductors 24A.

Fourth Embodiment

Figure 13:
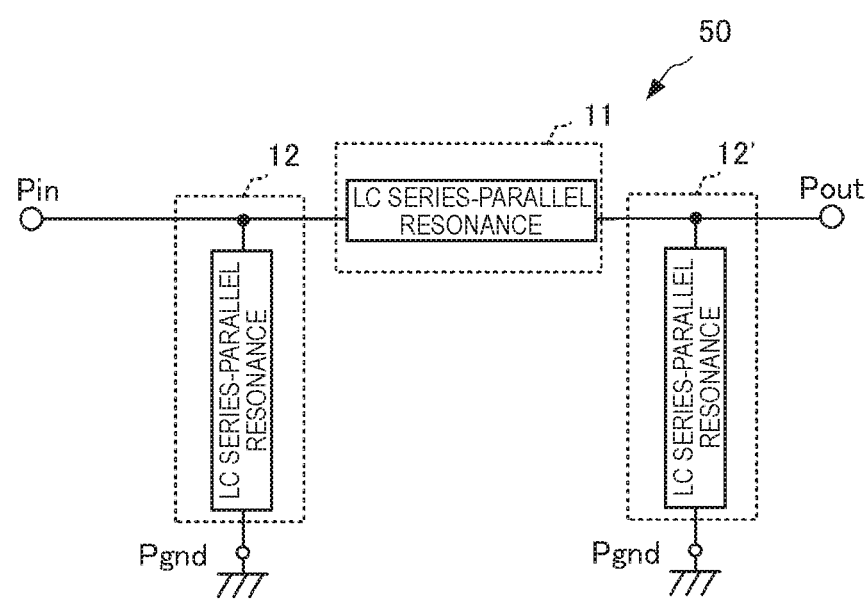
FIG. 13 is a circuit diagram of a variable filter circuit according to a fourth embodiment.

Next, a variable filter circuit according to a fourth embodiment of the present disclosure will be described. FIG. 13 is a circuit diagram of a variable filter circuit 50 according to the fourth embodiment of the present disclosure.

The variable filter circuit 50 has a π-type circuit configuration in which the serial arm 11 and the parallel arms 12, a parallel arm 12' are included. The serial arm 11 and the parallel arm 12 respectively have the same configurations as those of the first embodiment. The parallel arm 12' has the same configuration as the parallel arm 12, and is connected between the serial arm 11 and the output port Pout. Like this variable filter circuit 50, a variable filter circuit of the present disclosure can also be configured by including a plurality of parallel arms.

<<Variation>>

A case in which series inductors of the parallel arms 12 and 12' are connected to each other by the magnetic field coupling in the π-type circuit configuration of the fourth embodiment will be described. Hereinafter, a variable filter circuit having a π-type circuit configuration in which the magnetic field coupling is included is referred to as a "variable filter circuit 50'".

Figure 14A:
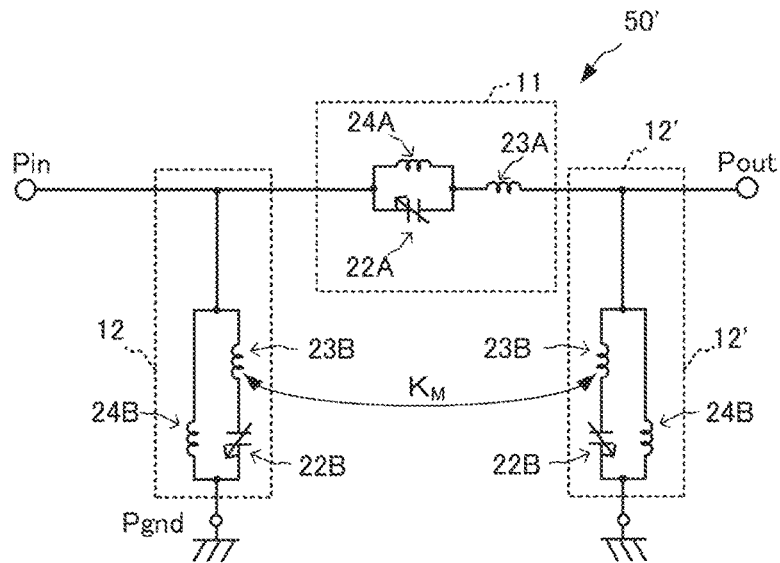
FIGS. 14A and 14B include a circuit diagram and a characteristic graph describing a case in which magnetic field coupling is generated between parallel arms in the fourth embodiment.

FIG. 14A is a circuit diagram illustrating an example of a circuit configuration of the variable filter circuit 50'. The serial arm 11 has the same circuit configuration as the serial arm 11A shown in FIG. 2A. The parallel arms 12 and 12' have the same circuit configuration as the parallel arm 12B shown in FIG. 3A.

In the variable filter circuit 50', the two parallel arms 12 and 12' (first parallel arm and second parallel arm) each provided with the series inductor 23B are connected to both sides of the serial arm 11 which is interposed between the parallel arms 12 and 12'. One of the series inductors 23B overlaps a magnetic field generated by the other of the series inductors 23B while the other of the series inductors 23B overlaps a magnetic field generated by the one of the series inductors 23B, whereby these two series inductors 23B are connected to each other by the magnetic field coupling so as to increase the inductance of each of the series inductors 23B. This magnetic field coupling can be such that a magnetic field coupling coefficient $K_M$ satisfies a relation of $|K_M| \leq 0.1$, for example. Hereinafter, a case of $|K_M|=0.05$ will be described.

Figure 14B:
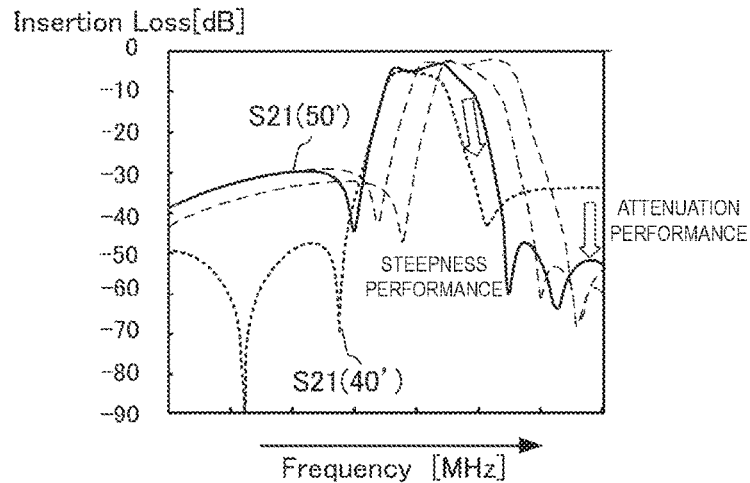

FIG. 14B is a characteristic graph exemplifying a bandpass characteristic S21(50') of the variable filter circuit 50'. Note that in FIG. 14B, a bandpass characteristic of the variable filter circuit 50' in the case where the center frequency is adjusted to move toward a higher frequency side is indicated by a broken line. Further, in FIG. 14B, the bandpass characteristic S21(40') of the variable filter circuit 40' having the above-discussed T-type circuit configuration in which the magnetic field coupling is included is indicated by a dotted line for comparison.

Also in the bandpass characteristic S21(50') of the variable filter circuit 50' having the π-type circuit configuration in which the magnetic field coupling is included, a band pass characteristic in which an attenuation pole is formed at a neighborhood frequency on a lower frequency side of the pass band and another attenuation pole is formed at a neighborhood frequency on a higher frequency side of the pass band can be obtained. As such, controlling the variable capacitance elements 22A and 22B respectively provided in the parallel arms 12, 12' and the serial arm 11 makes it possible to adjust the center frequency and the band width of the pass band.

Further, in the variable filter circuit 50' having the π-type circuit configuration in which the magnetic field coupling is included, an attenuation pole produced by series resonance of the series inductor 23B and the variable capacitance element 22B can be shifted toward a higher frequency side by the magnetic field coupling without necessarily increasing a circuit constant of the series inductor 23B. Even if the above frequency shift is carried out, because the circuit constant of the series inductor 23B is not increased, an increase in loss by the series inductor 23B will not be caused, whereby attenuation performance, steepness performance, or the like in a frequency band outside the pass band of the variable filter circuit 50' can be improved.

In reality, also in an example shown in FIG. 14B, in the bandpass characteristic S21(50') of the π-type circuit configuration including the magnetic field coupling, attenuation performance in a frequency band leaving from the pass band toward a higher frequency side is significantly improved compared to the bandpass characteristic S21(40') of the T-type circuit configuration including the magnetic field coupling. Further, in the bandpass characteristic S21(50') of the π-type circuit configuration including the magnetic field coupling, steepness performance in a neighborhood frequency band on a higher frequency side of the pass band is significantly improved compared to the bandpass characteristic S21(40') of the T-type circuit configuration including the magnetic field coupling.

As discussed above, in the variable filter circuit having the π-type circuit configuration, in the case where the two parallel arms 12 and 12' (the first parallel arm and the second parallel arm) are connected to both the sides of the serial arm 11 which is interposed between the parallel arms 12 and 12', connecting the parallel inductors 23B of the two parallel arms 12 and 12' to each other by the magnetic field coupling makes it possible to improve the attenuation performance and the steepness performance in the frequency band outside the pass band without necessarily causing the circuit configuration to become large in size.

Also in the variable filter circuit 50', like in the board layout illustrated earlier in FIGS. 12A-12C, among the mounting terminals of the two series inductors 23B, second mounting terminals P2 thereof on the port Pin side and the port Pout side can be not close each other.

Fifth Embodiment

Figure 15:
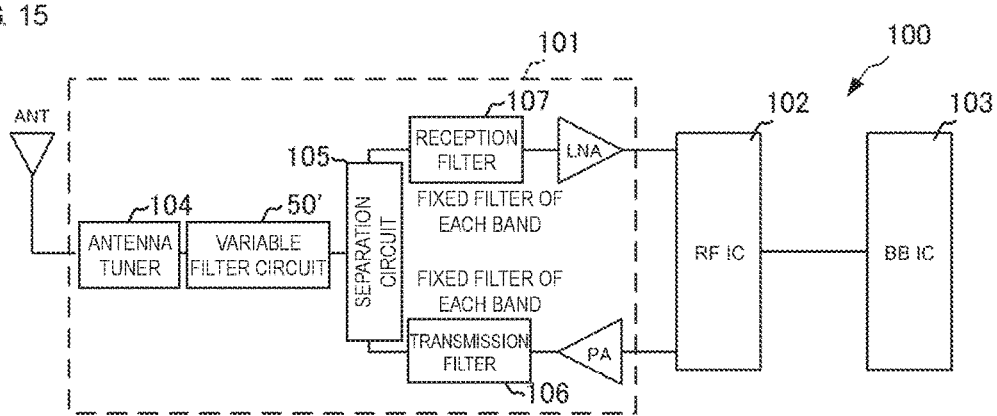
FIG. 15 is a block diagram of a communication device according to a fifth embodiment.

Next, a communication device and a high frequency module circuit according to a fifth embodiment of the present disclosure will be described. FIG. 15 is a block diagram of a communication device 100 according to the fifth embodiment of the present disclosure.

In the present embodiment, the communication device 100 is intended to serve in both a cellular use (800 MHz band) and a WLAN use (2.5 GHz band) at the same time. The communication device 100 includes a high frequency module circuit 101, an RFIC (Radio Frequency Integrated Circuit) 102, and a BBIC (Base Band Integrated Circuit) 103. The BBIC 103 outputs a base band signal to the RFIC 102. The RFIC 102 performs transmission signal processing and reception signal processing based on the base band signal. The high frequency module circuit 101 separates a transmission signal and a reception signal.

The high frequency module circuit 101 includes the aforementioned variable filter circuit 50', an antenna tuner 104, a separation circuit 105, a transmission filter 106, a reception filter 107, a power amplifier PA, and a low noise amplifier LNA. The variable filter circuit 50' may be changed to the variable filter circuit described in the other embodiments, variations.

The antenna tuner 104 is connected to an antenna ANT, and adjusts frequencies of a transmission signal and a reception signal respectively transmitted and received through the antenna ANT. The variable filter circuit 50' is connected between the separation circuit 105 and the antenna tuner 104. The separation circuit 105 is connected to the antenna ANT with the antenna tuner 104 and the variable filter circuit 50' interposed therebetween, and the separation circuit 105 separates the transmission signal and the reception signal. The reception filter 107 is connected between the separation circuit 105 and the RFIC 102, and performs filtering on the reception signal separated by the separation circuit 105 and outputs the reception signal having experienced the filtering to the RFIC 102 through the low noise amplifier LNA. The low noise amplifier LNA amplifies the reception signal. The RFIC 102 performs the reception signal processing on the inputted reception signal, and outputs the transmission signal to the power amplifier PA. The power amplifier PA amplifies the transmission signal. The transmission filter 106 is connected between the separation circuit 105 and the RFIC 102, and performs filtering on the transmission signal inputted through the power amplifier PA and outputs the signal having experienced the filtering to the separation circuit 105.

In the communication device 100 configured as discussed above, harmonics of the transmission signal are generated when the transmission signal is amplified by the power amplifier PA and harmonics of the reception signal are also generated when the reception signal is amplified by the low noise amplifier LNA. Most of the harmonics of the transmission signal are attenuated by the transmission filter 106; however, components of the harmonics that cannot be sufficiently attenuated by the transmission filter 106 are radiated through the antenna ANT and will cause various kinds of troubles unless the variable filter circuit 50' is provided. Further, most of the harmonics of the reception signal are attenuated by the reception filter 107; however, components of the harmonics that cannot be sufficiently attenuated by the reception filter 107 are radiated through the antenna ANT and will cause various kinds of troubles unless the variable filter circuit 50' is provided.

As such, the communication device 100 is provided with the variable filter circuit 50' between the antenna tuner 104 and the separation circuit 105 so that the variable filter circuit 50' attenuates the harmonics of the transmission signal and the reception signal. Accordingly, with this communication device 100, harmonics of the transmission signal, the reception signal, and the like can be prevented from being radiated through the antenna ANT.

Further, in the communication device 100, insertion loss of the variable filter circuit 50' can be reduced because of the number of variable reactance elements being lessened in the variable filter circuit 50', and a load on the power amplifier PA can be reduced even if the variable filter circuit 50' is used. Moreover, because the variable filter circuit 50' can be configured to be compact in size, an increase in circuit size of the overall system can be suppressed even if the variable filter circuit 50' is additionally provided.

The present invention can be implemented as discussed in the above embodiments and working examples. It is to be noted that the present invention can be implemented in any other configuration than the configurations having been discussed in the above embodiments and working examples as long as the configuration is equivalent to the configurations disclosed in the appended claims. For example, variable inductance is not limited to variable capacitance, and can be an element, a circuit, or the like having variable inductive reactance. In such case, it is sufficient to employ an element, a circuit, or the like having fixed capacitive reactance as a series reactance element, a parallel reactance element, or the like.

REFERENCE SIGNS LIST 10, 30, 40, 50, 50' VARIABLE FILTER CIRCUIT
11, 11A, 11C, 11E, 11G SERIAL ARM
12, 12B, 12D, 12F, 12H PARALLEL ARM
22A, 22B, 22C, 22D VARIABLE CAPACITANCE ELEMENT
23A, 23B, 23C, 23D SERIES INDUCTOR
24A, 24B, 24C, 24D PARALLEL INDUCTOR
31 INPUT STAGE MATCHING CIRCUIT
32 OUTPUT STAGE MATCHING CIRCUIT
100 COMMUNICATION DEVICE
101 HIGH FREQUENCY MODULE CIRCUIT
102 RFIC
103 BBIC
104 ANTENNA TUNER
105 SEPARATION CIRCUIT
106 TRANSMISSION FILTER
107 RECEPTION FILTER
PA POWER AMPLIFIER
LNA LOW NOISE AMPLIFIER

The invention claimed is:

1. A variable filter circuit comprising:
a plurality of serial arms, a first serial arm including a plurality of circuit elements that are connected in series with respect to a signal path; and
a first parallel arm including a plurality of circuit elements that are connected between the signal path and ground,
wherein the first serial arm and the first parallel arm each includes:
a variable reactance element;
a series reactance element connected in series to the variable reactance element and that resonates with the variable reactance element; and
a parallel reactance element connected in parallel to the variable reactance element and that resonates with the variable reactance element,
wherein, in each of the first serial arm and the first parallel arm, a frequency at which the variable reactance element and the parallel reactance element resonate is lower than a frequency at which the variable reactance element and the series reactance element resonate, and
wherein at least one of the plurality of serial arms is connected on each side of the first parallel arm.

2. The variable filter circuit according to claim 1, wherein, in the first serial arm, the variable reactance element and the parallel reactance element are connected in parallel and form a parallel circuit, and the series reactance element is connected in series to the parallel circuit.

3. The variable filter circuit according to claim 2, wherein, in the first parallel arm, the variable reactance element and the parallel reactance element are connected in parallel and form a parallel circuit, and the series reactance element is connected in series with the parallel circuit.

4. The variable filter circuit according to claim 2, wherein, in the first parallel arm, the variable reactance element and the series reactance element are connected in series, and the parallel reactance element is connected in parallel with the variable reactance element and the series reactance element.

5. The variable filter circuit according to claim 1, wherein, in the first parallel arm, the variable reactance element and the series reactance element are connected in series, and the parallel reactance element is connected in parallel with the variable reactance element and the series reactance element.

6. The variable filter circuit according to claim 1, wherein, in the first parallel arm, the variable reactance element and the parallel reactance element are connected in parallel and form a parallel circuit, and the series reactance element is connected in series with the parallel circuit.

7. The variable filter circuit according to claim 1, wherein the variable reactance element is a variable capacitance element, and
the series reactance element and the parallel reactance element are inductors.

8. The variable filter circuit according to claim 1, further comprising:
a second serial arm of the plurality of serial arms having a same configuration as the first serial arm, the first serial arm and the second serial arm being respectively connected to each side of the first parallel arm in the signal path,
wherein the parallel reactance element of the first serial arm and the parallel reactance element of the second serial arm are inductors connected by a magnetic field coupling.

9. The variable filter circuit according to claim 8,
wherein the inductors connected by the magnetic field coupling are components mounted on a chip, and
wherein each of the inductors has a first mounting terminal on a first side of the chip where components are connected to each other, and a second mounting terminal on a second side where the components are connected to circuit input/output portions.

10. The variable filter circuit according to claim 1,
wherein a matching circuit is provided at an input or output end of the signal path, the matching circuit making a normalized impedance of the variable filter circuit approach a value of 1 when viewed from the input or output end.

11. A high frequency module circuit comprising:
the variable filter circuit according to claim 1;
an antenna tuner connected to an antenna;
a separation circuit configured to separate a transmission signal and a reception signal;
a transmission filter that filters the transmission signal and outputs a filtered signal to the separation circuit; and
a reception filter that filters the reception signal separated by the separation circuit,
wherein the variable filter circuit is disposed between the separation circuit and the antenna tuner.

12. The high frequency module circuit according to claim 11, further comprising:
a power amplifier,
wherein the power amplifier amplifies a transmission signal and outputs the amplified signal to the transmission filter.

13. A communication device comprising:
the high frequency module circuit according to claim 12; and
a radio frequency integrated circuit (RFIC),
wherein the RFIC outputs a transmission signal to the power amplifier.

14. A variable filter circuit comprising:
a serial arm including a plurality of circuit elements that are connected in series with respect to a signal path; and
a parallel arm including a plurality of circuit elements that are connected between the signal path and ground,
wherein the serial arm and the parallel arm each includes:
a variable reactance element;
a series reactance element connected in series to the variable reactance element and that resonates with the variable reactance element; and
a parallel reactance element connected in parallel to the variable reactance element and that resonates with the variable reactance element,
wherein, in each of the serial arm and the parallel arm, a frequency at which the variable reactance element and the parallel reactance element resonate is lower than a frequency at which the variable reactance element and the series reactance element resonate, and
wherein, in the serial arm, the variable reactance element and the series reactance element are connected in series, and the parallel reactance element is connected in parallel with the variable reactance element and the series reactance element.

15. The variable filter circuit according to claim 14,
wherein, in the parallel arm, the variable reactance element and the series reactance element are connected in series, and the parallel reactance element is connected in parallel with the variable reactance element and the series reactance element.

16. A variable filter circuit comprising:
a serial arm including a plurality of circuit elements that are connected in series with respect to a signal path; and
a parallel arm including a plurality of circuit elements that are connected between the signal path and ground,
wherein the serial arm and the parallel arm each includes:
a variable reactance element;
a series reactance element connected in series to the variable reactance element and that resonates with the variable reactance element; and
a parallel reactance element connected in parallel to the variable reactance element and that resonates with the variable reactance element,
wherein, in each of the serial arm and the parallel arm, a frequency at which the variable reactance element and the parallel reactance element resonate is lower than a frequency at which the variable reactance element and the series reactance element resonate, and
wherein, in the parallel arm, the variable reactance element and the parallel reactance element are connected in parallel and form a parallel circuit, and the series reactance element is connected in series with the parallel circuit.

* * * * *